(12) United States Patent
Kondo et al.

(10) Patent No.: US 6,201,741 B1
(45) Date of Patent: Mar. 13, 2001

(54) STORAGE DEVICE AND A CONTROL METHOD OF THE STORAGE DEVICE

(75) Inventors: Tetsujiro Kondo, Tokyo; Akihiro Okumura, Kanagawa, both of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/383,512

(22) Filed: Aug. 26, 1999

(30) Foreign Application Priority Data

Aug. 28, 1998 (JP) .................................................. 10-242773

(51) Int. Cl.$^7$ .................................................. G11C 16/04
(52) U.S. Cl. .................................... 365/189.01; 365/149
(58) Field of Search ......................... 365/189.01, 230.06, 365/230.08, 230.01, 149, 129

(56) References Cited

U.S. PATENT DOCUMENTS

| | | | |
|---|---|---|---|
| 5,694,369 | * 12/1997 | Abe | .......................................... 365/210 |
| 5,740,118 | * 4/1998 | Sato et al. | .............................. 365/222 |
| 5,754,481 | * 5/1998 | Yabe et al. | ........................ 365/189.05 |
| 5,883,851 | * 3/1999 | Lee | .................................... 365/230.03 |

* cited by examiner

*Primary Examiner*—David Nelms
*Assistant Examiner*—Hoai V. Ho
(74) *Attorney, Agent, or Firm*—Frommer Lawrence & Haug, LLP.; William S. Frommer; Darren M. Simon (57) ABSTRACT

A storage device for storing data, comprising: storage means having storage units specified by first and second addresses; specification means for specifying storage units of said storage means correspondingly to said first address; a plurality of switching means, disposed in parallel, for making a storage unit corresponding to said second address capable of data reading and writing, of said storage units corresponding to said first address; and a plurality of control means for controlling said switching means such that, when a plurality of said second addresses are specified, storage units corresponding to the plurality of second addresses, respectively, of said storage units corresponding to said first address, are made capable of data reading and writing.

10 Claims, 10 Drawing Sheets

FIG. 7A CLOCK
FIG. 7B READ DATA
FIG. 7C WRITE DATA
FIG. 7D OPERATION TIMING

STORAGE DEVICE AND A CONTROL METHOD OF THE STORAGE DEVICE

DESCRIPTION OF THE RELATED ART

Conventionally well-known semiconductor memories to and from which data can be written and read at the same time include, e.g., a field memory (frame memory), a multiport memory, and a two-port memory incorporated in logic LSI (logic large scale integration).

Figure 8:
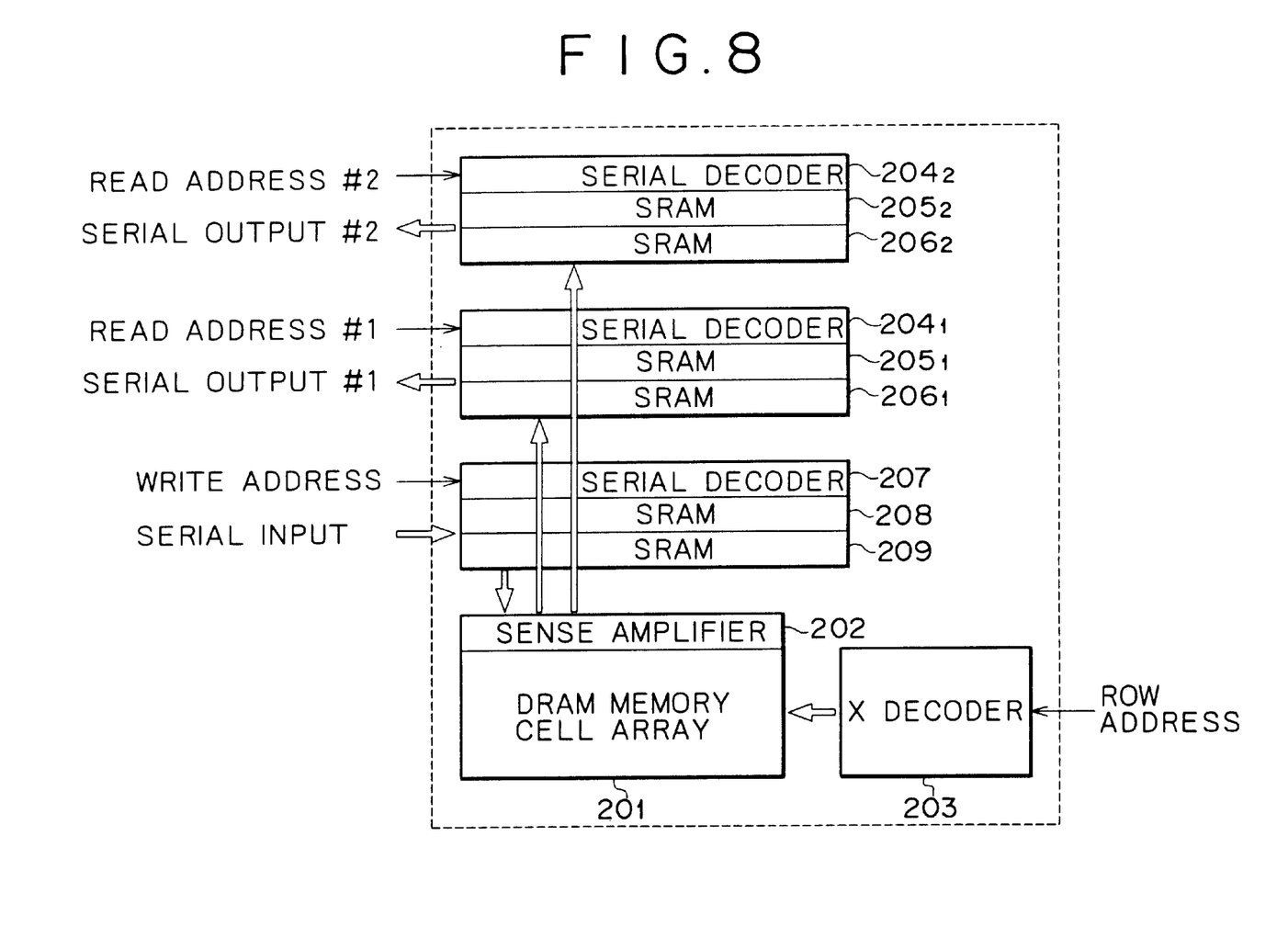
FIG. 8 is a block diagram showing a configuration of a related field memory.

FIG. 8 shows a configuration of an example a related field memory (frame memory).

A DRAM (dynamic random access memory) memory cell array 201 comprises memory cells (DRAM memory cells) requiring so-called refresh operations that are disposed in the row and column directions, each memory cell being located by a row address and a column address for locating the respective positions.

When data is written, data (serial input) to be written to a field memory, a row address corresponding to a memory cell to which to write the data, and a column address as a write address are supplied.

The row address is decoded supplied to an X decoder 203 and the decoded row address is supplied to a DRAM memory cell array 201. This determines memory cells in the row direction to which to write the data.

The write address as a column address is decoded supplied to a serial decoder 207. Furthermore, the data to be written is supplied to an SRAM (static random access memory) 208 or 209. In the SRAM 208 or 209, in accordance with the result of decoding the column address in the serial decoder 207, the data to be written, to be supplied thereto, is temporarily stored. Thereafter, the data stored in the SRAM 208 or 209 is written supplied to a memory cell of the row determined by the result of decoding the row address in the X decoder 203.

The SRAMs 208 and 209 are alternately used by performing bank switching. Specifically, after data to be written is stored in either of the SRAMs 208 and 209, while the data is being written to the DRAM memory cell array 201, the next data to be written is stored in the other. By this process, data is successively written.

On the other hand, when data is read, the row address of a memory cell in which data (serial output) to be read from the field memory is stored, and a read address as a column address is supplied.

The row address is decoded supplied to the X decoder 203 and the decoded row address is supplied to the DRAM memory cell array 201. This determines memory cells in the row direction from which to read data. Data is read from the memory cells in the row direction and is amplified and latched in a sense amplifier 202. The amplified and latched data is temporarily stored supplied to the SRAM 2051 or 2061.

On the other hand, the read address as the column address is decoded supplied to a serial decoder 2041. From the SRAM 2051 or 2061 in which the data read from memory cells of the row specified by the row address is stored, the data is read in accordance with the result of decoding the column address in the serial decoder 2041 and is output out of the field memory.

The SRAMs 2051 and 2061 are alternately used by performing bank switching, like the SRAMs 208 and 209. specifically, after data read from memory cells is stored in either of the SRAMs 2051 and 2061, while the data is being read out of the field memory, the next data read from memory cells is stored in the other. By this process, data is successively read.

In FIG. 8, the re are provided a serial decoder 2041, and SRAMs 2051 and 2061, and similarly configured serial decoder 2042, and SRAMS 2052 and 2062. Namely, two read ports are provided, thereby enabling simultaneous reading of two pieces of data.

In the above described field memory, by presenting a write address as a column address and a read address at the same time, data can be read and written at the same time.

When the timing of data transfer from the DRAM memory cell array 201 to the SRAM 2051 or 2061 (SRAM 2052 or 2062) coincides with the timing of data transfer from the SRAM 208 or 209 to the DRAM memory cell array 202, namely, when the timings of reading and writing data from and to the DRAM memory cell array 202 coincide with each other, either writing or reading is performed precedently by the arbiter not shown.

The size (capacity) of the SRAMs 2051, 2052, 2061, 2062, 208, and 209 is determined based on the frequency of data (serial input) to be written and the operating speed of the DRAM memory cell array 201 to allow for the concurrent execution of data reading and data writing in the DRAM memory cell array 201.

Figure 9:
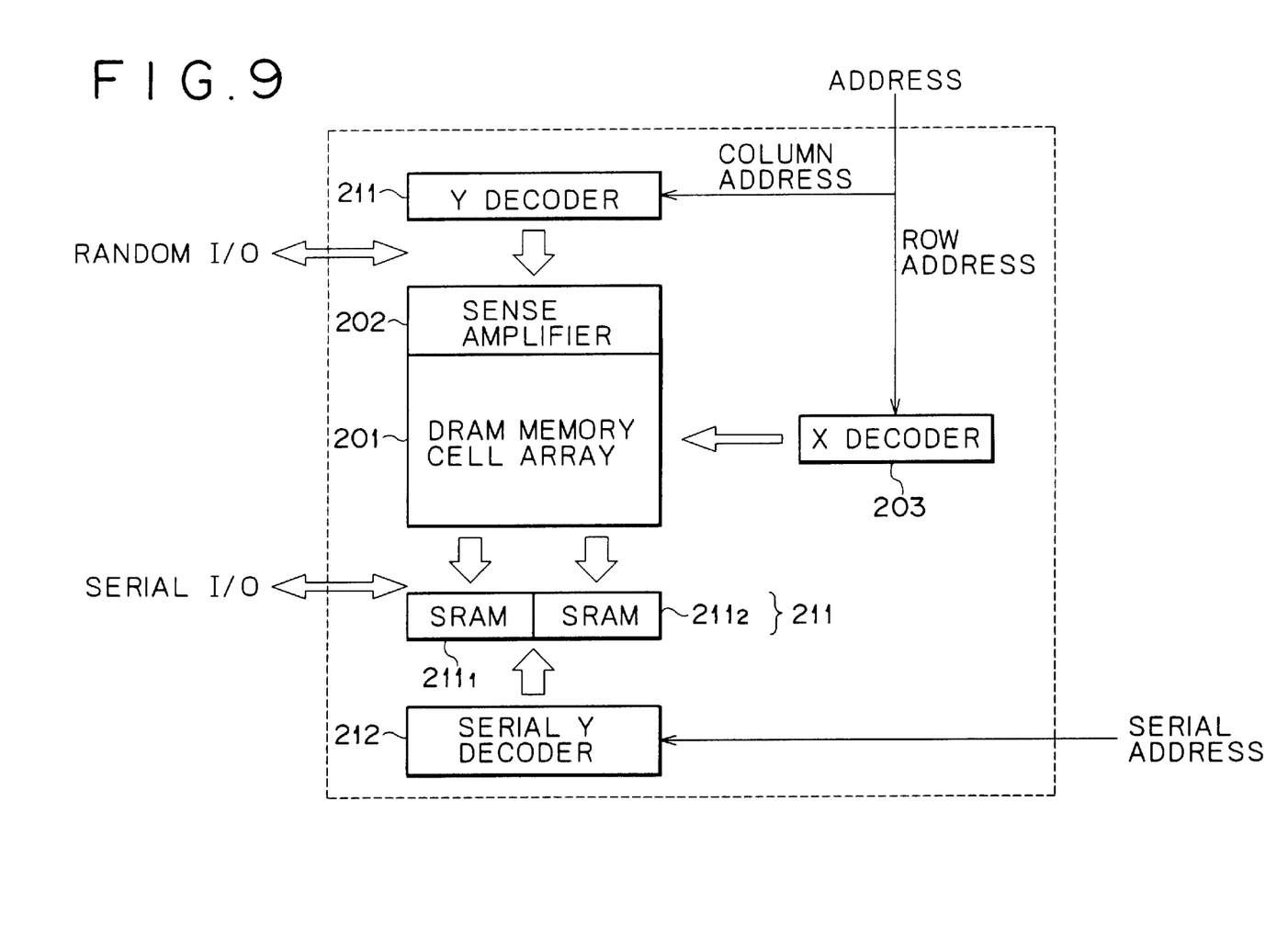
FIG. 9 is a block diagram showing a configuration of a related multiport memory.

FIG. 9 shows a configuration of an example of a related multiport memory (dual port memory). FIG. 9 uses identical reference numerals for corresponding portions in FIG. 8.

Referring to FIG. 9, two ports, random I/O (input/output) and serial I/O, are provided, and row addresses or column addresses are decoded supplied to the X decoder 203 or Y decoder 211.

When data is read or written via random I/O, the data is read from or written to a memory cell located by the result of decoding a row address or column address in the X decoder 203 or Y decoder 211, respectively. When data is read or written via serial I/O, memory cells of a row located by the result of decoding a row address in an X decoder 204 are targeted for processing and data stored therein is read and supplied to the SRAM part 211, or data stored in the SRAM part 211 is written.

A multiport memory as described above allows concurrent execution of data reading and data writing in a manner that writes data via either random I/O or serial I/O and reads data via the other.

In other words, for example, when data is written via random I/O and data is read via serial I/O, data to be written is input via the random I/O and a row address and a column address for locating a memory cell to which to write the data are input. As described above, a row address or a column address is decoded in the X decoder 203 or Y decoder 211, respectively, and the data to be written is written to a memory cell of the DRAM memory cell array 201 located by the decoding result.

A row address for locating the row of a memory cell in which data to be read is stored is supplied at a timing slightly different from the timing at which a row address for locating the row of a memory cell to which to write data to be written is supplied, and the row address is also decoded in the X decoder 203. The data is read from memory cells of a row located by the decoding result and is supplied to and stored in the SRAM part 211.

On the other hand, a serial address for specifying an address of the SRAM part 211 is supplied to a Y decoder 212 for serial access, which decodes the serial address. Data is read from the address of the SRAM part 211 correspondingly to the decoding result and is output via serial I/O.

In FIG. 9, the SRAM part 211 comprises two SRAMs 2111 and 2112, thereby enabling a continuous serial transfer of data by a split buffer transfer method. Specifically, after data supplied to the SRAM part 211 is stored in either of the SRAMs 2111 and 2112, while the data is being transferred, the next data to be supplied to the SRAM part 211 is stored on the other of the SRAMs 2111 and 2112. This enables continuous input/output of data.

Each of the SRAMs 2111 and 2112 has a storage capacity equivalent to the half of the number of columns of memory cells constituting the DRAM memory cell array 201.

As described above, according to a storage device and a control method of the storage device of the present invention, the storage device comprises storage means having storage units specified by first and second addresses, specification means for specifying storage units of the storage means correspondingly to a first address, and a plurality of switching means, disposed in parallel, for making a storage unit corresponding to a second address capable of data reading and writing, of the storage units corresponding to the first address, wherein when a plurality of second addresses are specified, the switching means is controlled such that storage units corresponding to the plurality of second addresses, respectively, of the storage units corresponding to the first address, are made capable of data reading and writing. With this construction, there can be provided a small-size storage device that enables concurrent execution of data reading and data writing.

As described above, conventional semiconductor memories on which data reading and data writing are performed at the same time, for example, the field memory (FIG. 8) and the multi-port memory (FIG. 9), require SRAM for buffering data. There has been a problem that SRAM is larger than, e.g., DRAM, and therefore the entire semiconductor memory on which data reading and data writing are performed at the same time becomes large.

Although the SRAM part 211 is shown considerably smaller than the DRAM memory cell array 201 in FIG. 9, in an actual multiport memory, the SRAM part 211 has a size of about the half of that of the DRAM memory cell array 201. Therefore, the size of the memory in FIG. 9 is about 1.5 times the size of the DRAM on which data reading and data writing are performed at different timings.

Figure 10:
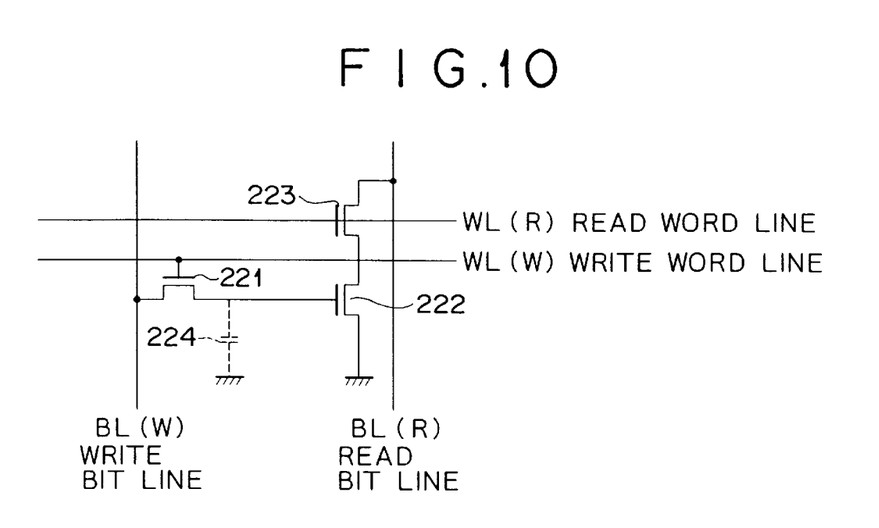
FIG. 10 is a schematic circuit diagram showing a configuration of a line memory cell used in a related ASIC.

FIG. 10 shows a configuration of a line memory cell used in a related ASIC (application specific integrated circuit).

In FIG. 10, an FET (N channel FET (field effect transistor)) 221 and a capacitor 224 constitute a fundamental memory cell for storing data. The drain or gate of the FET 221 is connected to a write bit line BL (W) or a write word line WL (W), respectively, and the source thereof is connected to one end of a capacitor 224 the other end of which is grounded.

A connection point between the source of the FET 221 and the capacitor 224 is connected to the gate of the FET (N channel FET) 222. The source of the FET 222 is grounded and the drain thereof is connected to the source of the FET (N channel FET) 223. The gate or drain of the FET 223 is connected to a read word line WL (R) or a read bit line BL (R), respectively.

In a memory cell thus configured, during data writing, the write word line WL (W) is driven from a low level into a high level and the FET 221 is turned on. Data to be written is output to the write bit line BL (W) and thereby is stored in the capacitor 224 via the turned-on FET 221 (the capacitor 224 is charged correspondingly to the data to be written).

On the other hand, during data reading, the read word line WL (R) is driven from a low level into a high level and the FET 223 is turned on. Whether to turn the FET 222 on or off is determined by charges stored in the capacitor 224, and in response to whether the FET 222 is on or off, a voltage correspondingly to the data stored in the capacitor 224 develops on the read bit line BL (R).

As described above, in the line memory cell in FIG. 10, since the write word line WL (W) and write bit line BL (W) used to write data and the read word line WL (R) and read bit line BL (R) used to read data are provided, data writing and data reading can be performed at the same time.

However, although it is natural that one memory cell can be constituted by the FET 221 and the capacitor 224, since two independent sets of a word line and a bit line are provided for reading and writing, the FETs 222 and 223 are required in addition to the FET 221 and the capacitor 224. Consequently, one memory cell becomes large, and as a result, an entire semiconductor memory also become large-scale.

Although the above described memory is called an asynchronous memory, a method is available which allows data writing and data reading to be performed apparently at the same time by switching two banks using a synchronous memory of one port.

Figure 11:
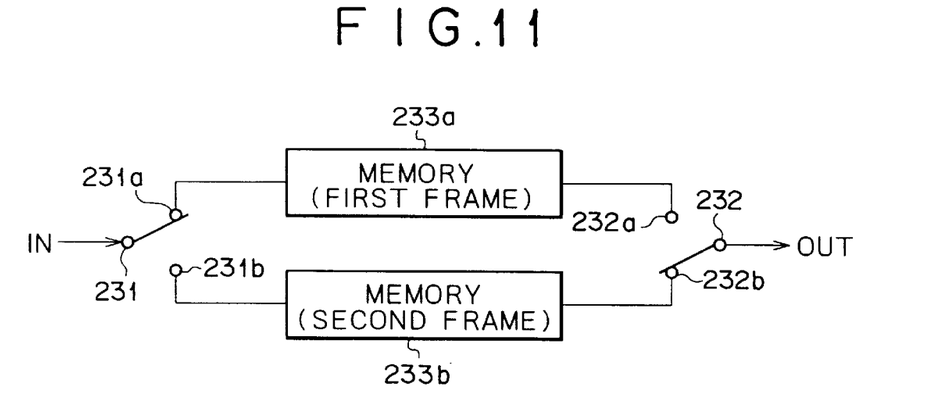
FIG. 11 is a block diagram showing a configuration of a memory of a related memory bank switching system.

FIG. 11 shows a configuration of a memory of such a bank switching system.

Data to be written is input to a switch 232. A switch 231 is one end of a terminal 231a or 231b. For example, the terminal 231a is selected and connected to a memory 233a. Accordingly, in this case, the data to be written is supplied to the memory 233a via the switch 231 and terminal 231a and stored therein. When the data to be written has been stored in, e.g., all storage areas of the memory 233a, the switch 231 selects another of the terminals 231a and 231b, or the terminal 231b. Accordingly, in this case, the data to be written is supplied to the memory 233b via the switch 231 and terminal 231b and stored therein. When the data to be written has been stored in, e.g., all storage areas of the memory 233b, the switch 231 selects the terminal 231a again, and thereafter the same operations are repeated.

On the other hand, the switch 232 operates in conjunction with the switch 231. Specifically, when the switch 231 selects the terminal 231a or 231b, the terminal 232b or 232a is selected respectively, and the terminal 232a or 232b is connected to the memory 232a or 232b, respectively. Accordingly, when the switch 231 selects the terminal 231a and data to be written is written to the memory 233a, the switch 232 selects the terminal 232b and thereby data stored in the memory 233b is read via the terminal 232b and the terminal 232. When the switch 23 selects the terminal 231b and data to be written is written to the memory 233b, the switch 232 selects the terminal 232a and thereby data stored in the memory 233a ia read via the terminal 232a and the terminal 232. In the way described above, data writing and data reading are performed apparently at the same time.

However, the configuration of a memory of the bank switching system shown in FIG. 11 requires two memories 233a and 233b, also resulting in a large memory size. Specifically, although a memory essentially required to store data is either of the two memories 233a and 233b, concurrent execution of data reading and data writing requires the two memories 233a and 233b, and as a result, the size of the memory in FIG. 11 is about twice the size of a memory essentially required to store data.

SUMMARY OF THE INVENTION

An object of the present invention is to miniaturize a memory that enables concurrent execution of data reading and data writing.

A storage device of the present invention comprises storage means having storage units specified by first and second addresses; specification means for specifying storage units of the storage means correspondingly to the first address; a plurality of switching means, disposed in parallel, for making a storage unit corresponding to the second address capable of data reading and writing, of the storage units corresponding to the first address; and a plurality of control means for controlling the switching means such that, when a plurality of second addresses are specified, storage units corresponding to the plurality of second addresses, respectively, of the storage units corresponding to the first address, are made capable of data reading and writing.

A control method of a storage device of the present invention, wherein the storage device comprises storage means having storage units specified by first and second addresses, specification means for specifying storage units of the storage means correspondingly to a first address, and a plurality of switching means disposed in parallel for making a storage unit corresponding to a second address capable of data reading and writing, of the storage units corresponding to the first address, controls the switching means such that, when a plurality of second addresses are specified, storage units corresponding to the plurality of second addresses, respectively, of the storage units corresponding to the first address, are made capable of data reading and writing.

In a storage device of the present invention, the storage means has storage units specified by first and second addresses and the specification means specifies storage units of the storage means correspondingly to a first address. The plurality of switching means, disposed in parallel, make a storage unit corresponding to a second address capable of data reading and writing, of the storage units corresponding to the first address. The plurality of control means controls the switching means such that, when a plurality of second addresses are specified, storage units corresponding to the plurality of second addresses, respectively, of the storage units corresponding to the first address, are made capable of data reading and writing.

A control method of a storage device of the present invention, wherein the storage device comprises storage means having storage units specified by first and second addresses, specification means for specifying storage units of the storage means correspondingly to a first address, and a plurality of switching means disposed in parallel for making a storage unit corresponding to a second address capable of data reading and writing, of the storage units corresponding to the first address, controls the switching means such that, when a plurality of second addresses are specified, storage units corresponding to the plurality of second addresses, respectively, of the storage units corresponding to the first address, are made capable of data reading and writing.

As described above, according to a storage device and a control method of the storage device of the present invention, the storage device comprises storage means having storage units specified by first and second addresses, specification means for specifying storage units of the storage means correspondingly to a first address, and a plurality of switching means disposed in parallel for making a storage unit corresponding to a second address capable of data reading and writing, of the storage units corresponding to the first address, wherein when a plurality of second addresses are specified, the switching means is controlled such that storage units corresponding to the plurality of second addresses, respectively, of the storage units corresponding to the first address, are made capable of data reading and writing. With this construction, there can be provided a small-size storage device that enables concurrent execution of data reading and data writing.

Prior applications related to the present application filed by the applicant are:

(1) Japanese Patent Application No. H10-022172 (Corresponding to US application is now pending)
(2) Japanese Patent Application No. H10-032913 (Corresponding to US application is now pending)

DETAILED DESCRIPTION OF PREFERRED EMBODIMENTS

Hereinafter, a description will be made of embodiments of the present invention. As preparation for the preliminary stage, a description will be made of a DRAM chip on which data reading and data writing are performed at different timings.

Figure 1:
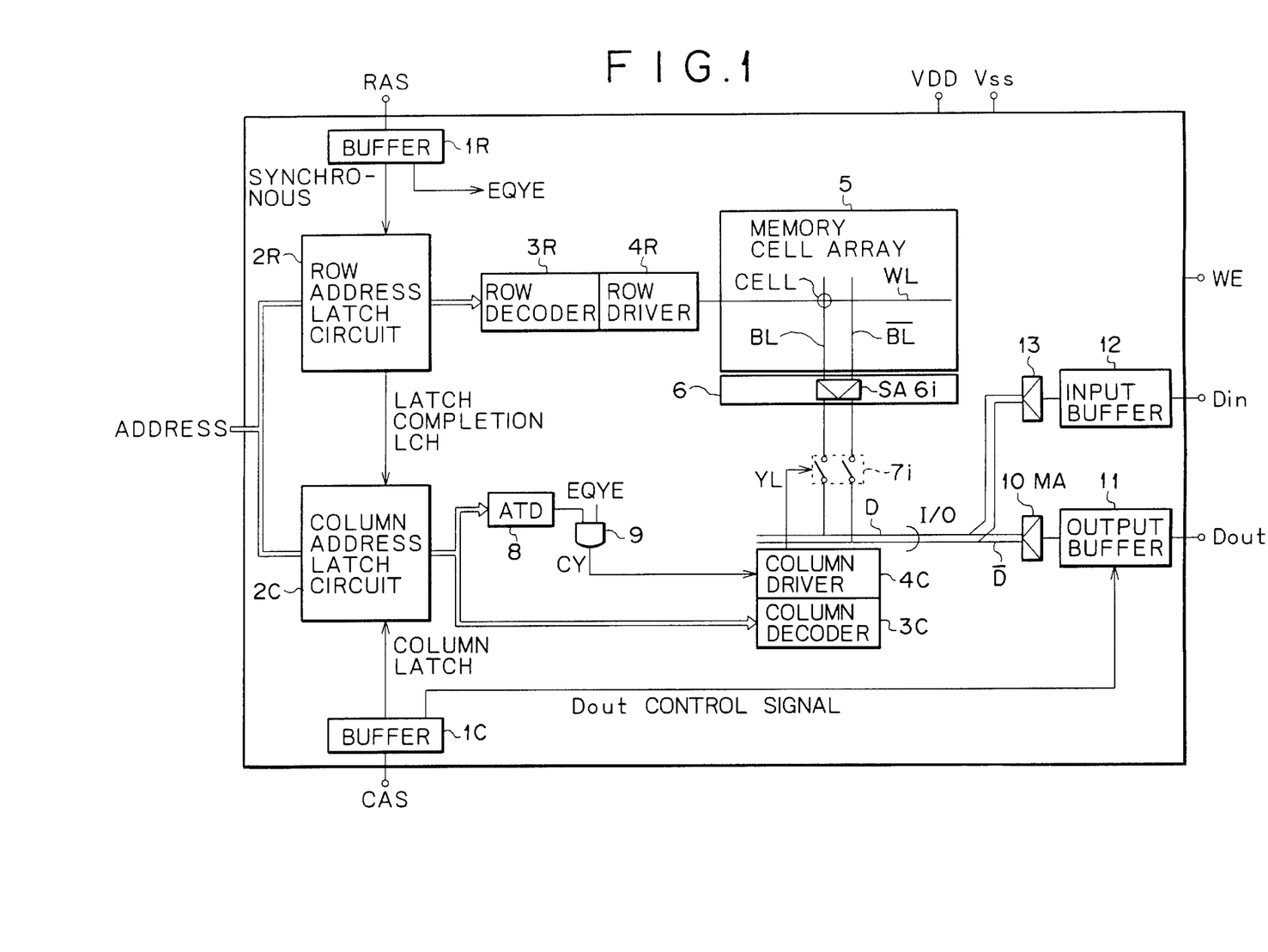
FIG. 1 shows a configuration of a DRAM chip on which data reading and data writing are performed at different timings.

FIG. 1 shows a configuration of a DRAM chip on which data reading and data writing are performed at different timings.

Supplied to the DRAM chip are row and column addresses as an address for locating a memory cell, a RAS (row address strobe) signal synchronous to an input timing of a row address, a CAS (column address strobe) signal synchronous to an input timing of a column address, voltages VDD and VSS used as power supply, a write enable signal WE indicating reading or writing, etc.

A RAS signal is supplied to a buffer 1R, which outputs a sync signal to a row address latch circuit 2R synchronously with the RAS signal, wherein the sync signal is used to latch part of an address supplied to the DRAM chip as a row address. The buffer 1R generates an EQYE signal based on the RAS signal and supplies it to an input terminal of an AND gate 9. Specifically, the RAS signal also has the properties of a so-called chip enable signal, and the buffer 1R, based on the chip enable signal, generates an EQYE signal that goes to a high level, for example, when the DRAM chip is inactive, and a low level when active.

A CAS signal is supplied to a buffer 1C, which outputs a sync signal to a column address latch circuit 2C synchronously with the CAS signal, wherein the sync signal is used to latch part of an address supplied to the DRAM chip as a column address. The buffer IC generates a Dout control signal based on the CAS signal and supplies it to an output buffer 11, wherein the Dout control signal controls the timing at which the output buffer 11 latches and outputs data. Specifically, the CAS signal has the properties of a so-called output enable signal, and the buffer IC, based on the output enable signal, generates a Dout control signal for controlling the latching of data in the output buffer 11.

The row address latch circuit 2R, synchronously with a sync signal from the buffer 1R, latches part of an address supplied to the DRAM chip as a row address and supplies it to a row decoder 3R. Upon completion of the row address latching, the address latch circuit 2R supplies a latch completion signal LCH indicating the event to a column address latch circuit 2C.

The column address latch circuit 2C latches, as a column address, part of an address supplied to the DRAM chip synchronously with a sync signal from the buffer IC and a latch completion signal LCH from the row address latch circuit 2R and supplies it to a column decoder 3C and an ATD (address transit detector) circuit 8.

The row decoder 3R (specification means) or the column decoder 3C (control means) decodes a row address from the row address latch circuit 2R or the column address latch circuit 3C, and, based on the decoding result, controls the row driver 4R or the column driver 4C, respectively.

The row driver 4R drives a word line WL disposed in the row direction within the memory array 5 in accordance with control from the row decoder 3R, and thereby specifies memory cells (storage units) of a row to and from which to write and read data.

The column driver 4C controls the column switch 7i in accordance with control from the column decoder 3C and thereby connects bit lines BL or !BL disposed in the column direction within the memory cell array 5 to data buses D or !D, respectively so as to enable writing or reading data to or from the memory cell.

Although BL and others marked with a bar (¯) in FIG. 1 and other figures indicate the inversion of BL, this specification represents such BL and others marked with a bar (¯) as !BL, which denotes BL preceded with a mark !.

The memory cell array 5 (storage means) comprises memory cells disposed in the row and column directions, each memory cell being located by a row address and a column address for locating the respective positions. Specifically, the memory cell array 5 comprises N and M memory cells disposed in row and column directions, respectively. Furthermore, the memory cell array 5 has M word lines WL in the row direction and N (pairs) bit lines BL and !BL in the column direction, each memory cell corresponding to a point of intersection of a word line WL and bit lines BL and !BL. A memory cell corresponding to a point of intersection of a word line WL driven by the row driver 4R and bit lines BL and !BL connected to the data buses D and !D by the column driver 4C is targeted for data reading or writing.

A sense amplifier group 6 comprises as many SAs 61 to 6N as there are memory cells (columns of the memory cells) disposed in the row direction in the memory cell 5, and SA 6i (i=1, 2,..., N) amplifies and latches data read from indicated memory cells and outputs it to data buses D and !D via a column switch 7i.

As many column switches 7i (switching means) as SAs 6i are provided and are, in the column driver 4C, controlled to go on or off based on the result of decoding a column address in the column decoder 3C. Specifically, the column switch 7i, when on, electrically connects the data buses D and !D with bit lines BL and !BL connected to sense amplifiers 6i, and enables data writing or reading to or from the memory cell on the bit lines BL and !BL.

Although the DRAM chip in FIG. 1 is provided with N number of SAs 61 to 6N and N number of column switches 71 to 7N in the preceding description, one SA 6i and one column switch 7i are shown for simplicity of the figure.

The ATD circuit 8 generates an ATD signal that, based on the output of the column address latch circuit 2C, goes to a high level, for example, during transition (switching) of column addresses, and a low level in other cases, and supplies it to another input terminal of the AND gate 9.

The AND gate 9 performs a logical AND operation between an EQYE signal from the buffer 1R and an ATD signal from the ATD circuit 8 and supplies a short signal CY for causing a short between the data buses D and !D to the column driver 4C.

As described above, since the EQYE signal goes to a high level only when the DRAM chip is inactive, and the ATD signal goes to a high level only during transition of column addresses, the short signal CY goes to a high level only when the DRAM chip is inactive and during transition of column addresses and a low level in other cases. When the short signal CY is at a high level, the column driver 4C causes a short between the data buses D and !D, and thereby erases data on the data buses D and !D. In this way, data can be fast read and written from and to the memory cell array 5.

An MA (main amplifier) 10, connected to the data buses D and !D, amplifies data read from the memory cell array 5 and output to the data buses D and !D before supplying it to the output buffer 11. The output buffer 11 latches the data from the MA 10 in accordance with a Dout control signal from the buffer IC, and outputs it from the output terminal Dout.

An input buffer 12, connected to an input terminal Din, latches data to be written that is input from the input terminal Din, and supplies it to a recording amplifier 13. The recording amplifier 13 amplifies the data from the input buffer 12 and outputs it to the data buses D and !D.

Figure 2:
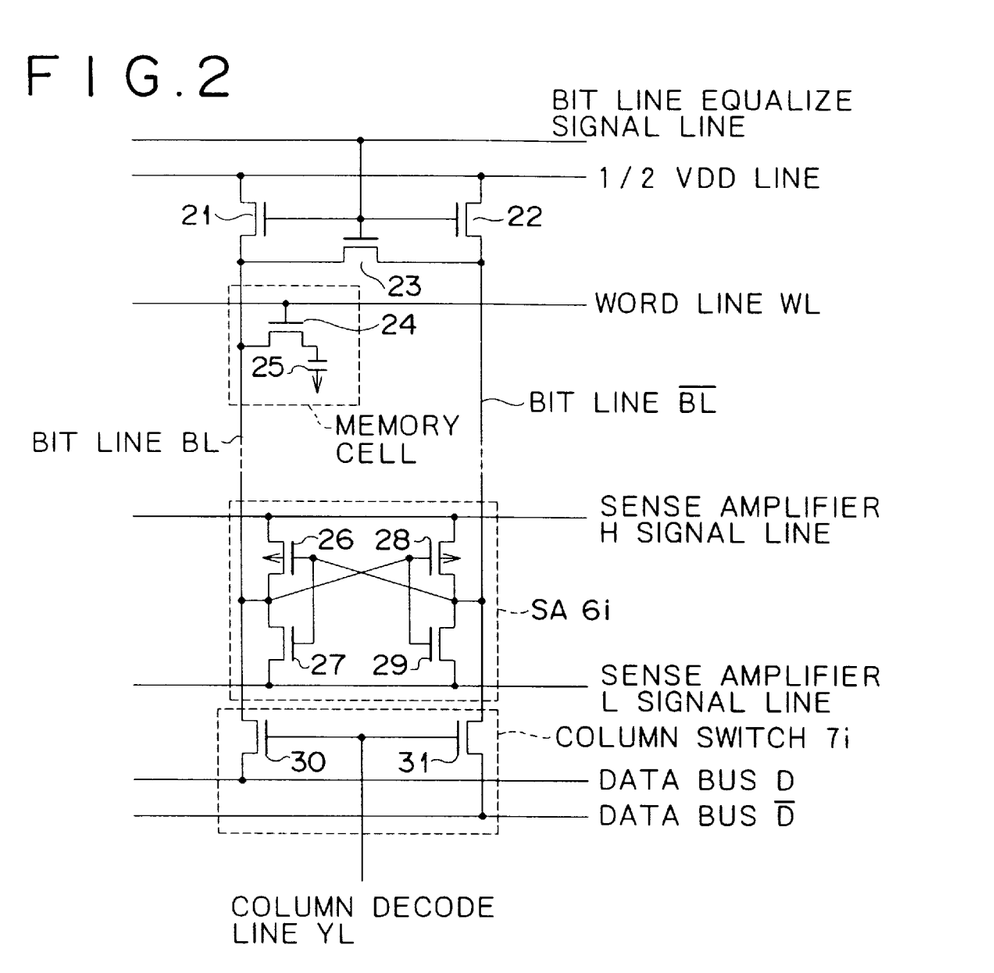
FIG. 2 is a schematic circuit diagram showing a configuration of memory cell arrays 5 and SA6$i$, and a column switch 7$i$ in FIG. 1.

Next, FIG. 2 shows a configuration of the memory cell array 5, SA 6i, and column switch 7i.

A bit equalize signal line is supplied with a bit line equalize signal that is driven into a low level when data is read from or written to the memory cell array 5, and stays low in other cases. To the bit equalize signal line are connected the gates of FETs (N channel FET) 21 to 23. The drains of the FETs 21 and 22 are connected to a ½ VDD line through which the half of voltage VDD is supplied, and the source of the FET 21 or 22 is connected to the drain or source of the FET 23, respectively. A connection point between the source of FET 21 and the drain of FET 23 is connected to one end of the bit line BL, and a connection point between the source of FET 22 and the source of FET 23 is connected to one end of the bit line !BL. In FIG. 1, the bit line equalize signal line and the ½ VDD line are omitted.

The bit line equalize signal line and the ½ VDD line are disposed in the row direction in the memory cell array 5, and as many circuits comprising three FETs 21 to 23 as the row-direction memory cells making up the memory cell 5 are provided.

To the bit line BL is further connected the drain of FET (N channel FET) 24, to the source of which one end of the capacitor 24 with the other end grounded is connected. The gate of the FET 24 is connected to the word line WL. The FET 24 and the capacitor 25 constitute one memory cell, and M column-direction and N row-direction memory cells thus configured are disposed in the memory cell array 5.

To the bit line BL is also connected the drain of the FET (P channel FET) 26, and a connection point between the bit line BL and the drain of the FET 26 is connected to the drain of the FET (N channel FET) 27 and the gate of the FET (P channel FET) 28. The gate of the FET 27 is connected to the gate of the FET 26.

The drain of the FET 28 is connected to the bit line !BL, the drain of the FET (N channel FET) 29, and a connection point between the gate of the FET 26 and the gate of the FET 27. The gate of the FET 28 and the gate of the FET 29 are connected, and a connection point between the gates is connected to a connection point between the drain of the FET 26 and the drain of the FET 27. The sources of the FETs 26 and 28 are connected to a sense amplifier H signal line and the sources of the FETs 27 and 29 are connected to a sense amplifier L signal line.

The above described FETs 26 to 29 constitute one SA 6i, and as described above, as many SAs 6i thus configured as the row-direction memory cells making up the memory cell array 5 are provided.

The sense amplifier H signal line and the sense amplifier L signal line are disposed parallel with the row direction in the memory cell array 5. The sense amplifier H signal line and the sense amplifier L signal line are supplied with a sense amplifier H signal or sense amplifier L signal as a predetermined high or low signal for driving the SA 6i, respectively. In FIG. 1, the sense amplifier H signal line and the sense amplifier L signal line are omitted.

The drain of FET (N channel FET) 30 or 31 is connected to the other end of bit line BL or !BL, respectively. The source of FET 30 or 31 is connected to the data bus D or !D, respectively. The gates of FETs 30 and 31 are connected to the column decode line YL.

The above described FETs 30 and 31 constitute one column switch 7i, and as described above, as many column switches 7i thus configured as the row-direction memory cells making up the memory cell array 5 are provided.

The column decode line YL is driven by the column driver 4C, whereby a high level or a low level is applied to the gate of the FETs 30 and 31 as the column switch 7i, the FETs 30 and 31 go on or off, and an electrical connection between the bit line BL or !BL and the data bus D or !D is controlled.

Referring to the timing chart of FIG. 3, the operation of the memory cell array 5, SA 6i, and the column switch 7i will be describe. The description below assumes that data is read from and written to memory cells each comprising the FET 24 and capacitor 25 shown in FIG. 2.

Figure 3A:
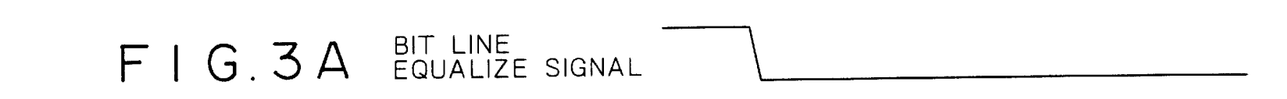
FIGS. 3A to 3I are timing charts for explaining the operation of memory arrays 5 and SA6$i$, and a column switch 7$i$ in FIG. 2.

During data reading or writing, as shown in FIG. 3A, a bit line equalize signal is driven from a high level into a low level. Since this causes the FETs 21 to 23 to go from the on state to the off state, the bit lines BL and !BL are electrically disconnected from the ½ VDD line through which the half of voltage VDD is supplied.

Figure 3B:
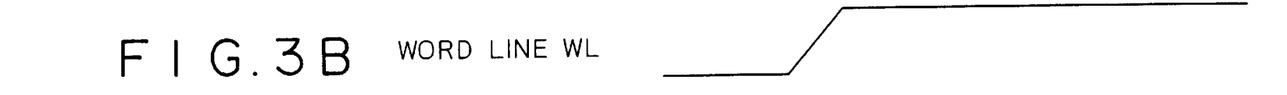

Thereafter, when the row address of a memory cell comprising the FET 24 and capacitor 25 is afforded to the row decoder 3R, the column decoder 3R decodes the row address and, in accordance with the decoding result, drives from a low level to a high level, as shown in FIG. 3B, a word line WL of the row of the memory cell comprising the FET 24 and capacitor 25, namely, a word line WL connected to the gate of FET 24. Thereby, the FET 24 goes from the off state to the on state, and the capacitor 25 connected to the source of the FET 24 is electrically connected with the bit line BL.

Figure 3C:
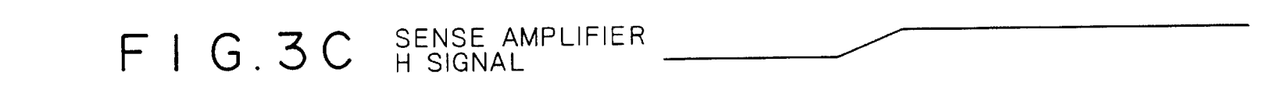
Figure 3D:
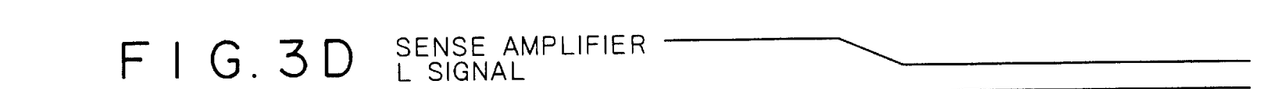

A sense amplifier H signal, as shown in FIG. 3(c), is driven from a low level into a high level, and a sense amplifier L signal, as shown in FIG. 3D, is driven from a high level into a low level. This places the SA 6i into operation.

Figure 3E:
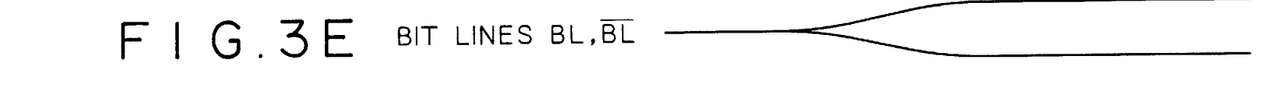

When the SA 6i is placed into operation, a voltage of the capacitor 25 developing on the bit line BL is differentially amplified and latched. As a result, as shown in FIG. 3E, a voltage on the bit line BL changes from the half of VDD to either of a high level and a low level, and a voltage on the bit line !BL changes from the half of VDD to the other.

Specifically, potential of the bit lines BL and !BL is VDD/2, which is a voltage on the ½ VDD line, since the FETs 21 to 23 are on when the bit line equalize signal is at a high level. When the bit line equalize signal changes from a high level to a low level, the FETs 21 to 23 change from the on state to the off state and the bit lines BL and !BL are disconnected from the ½ VDD line, but remain held to a potential of VDD/2 for a while, depending on the capacity of the bit lines BL and !BL. Further, when the word line WL changes from a low level to a high level, the bit line BL and the capacitor 25 are connected and potential of the bit line BL changes from VDD/2 by charges stored in the capacitor 25. When the SA 6i is placed into operation, a change of potential of the bit line BL is differentially amplified. Briefly, in the SA 6i, voltage of the capacitor 25 is differentially amplified relative to a voltage VDD/2.

Figure 3F:
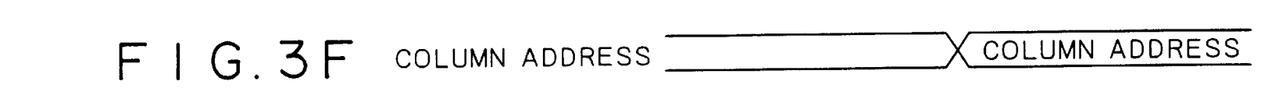
Figure 3G:
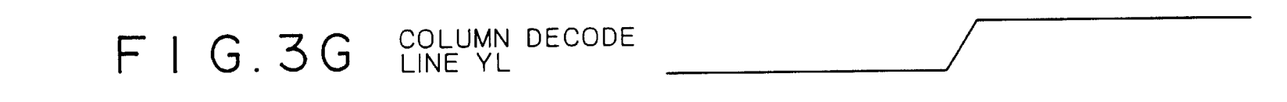

Thereafter, as shown in FIG. 3F, when the column address of a memory cell comprising the FET 24 and the capacitor 25 is afforded to the column decoder 3C, the column decoder 3C decodes the column address and controls the column decoder 4C such that, in accordance with the decoding result, the column switch 7i of the column of the memory cell comprising the FET 24 and the capacitor 25 is driven from the off state to the on state. In accordance with the control, the column decode line YL connected to the column switch 7i is driven from a low level into a high level as shown in FIG. 3G.

A high level on the column decode line YL is applied to the gates of the FETs 30 and 31 as the column switch 7i. This causes the FETs 30 and 31 to change from the off state to the on state, electrically connecting the bit line BL to the data bus D and the bit line !D to the data bus !D, respectively.

Figure 3H:
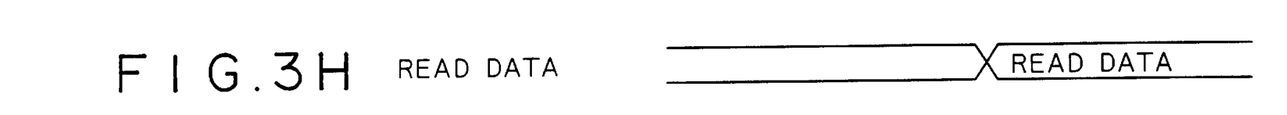

During data reading, the bit lines BL and !BL and the data buses D and !D are connected in the way described above, whereby voltage of the capacitor 25 differentially amplified in the SA 6i, that is, data stored in the memory cell comprising the FET 24 and the capacitor 25 is output onto the data buses D and !D as shown in FIG. 3H (data stored in the memory cell is output to the data bus D and the inversion of data stored in the memory cell is output to the data bus !D).

Figure 3I:
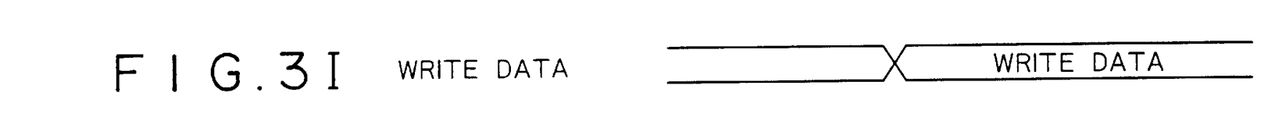

On the other hand, during data writing, after the bit lines BL and !BL and the data buses D and !D are connected in the way described above, data to be written is output onto the data bus D as shown in FIG. 3I. Charges corresponding to the data to be written are charged to the capacitor 25 via the bit line BL and the FET 24, whereby the data to be written is stored in the memory cell comprising the FET 24 and the capacitor 25.

Next, the operation of the DRAM chip in FIG. 1 will be described.

To the DRAM chip are input an address for locating a memory cell to and from which to write and read data, a RAS signal, a CAS signal, and the like. The address is supplied to the row address latch circuit 2R and the column address latch circuit 2C, and the RAS or CAS signal is supplied to the buffer 1R or 1C, respectively.

In the buffer 1R or 1C, a predetermined synchronous signal is generated based on the RAS or CAS signal, and is supplied to the row address latch circuit 2R or the column address latch circuit 2C, respectively. The row address latch circuit 2R, synchronously with the synchronous signal from the buffer 1R, latches an address supplied thereto as a row address, and outputs it to the row decoder 3R. The column address latch circuit 2C, synchronously with the synchronous signal from the buffer 1C, latches an address supplied thereto as a column address, and outputs it to the column decoder 3C and the ATD circuit 8.

The column address supplied to the ATD circuit 8 is used as an ATD signal described above, and is further used as a short signal CY after passing through the AND gate 9. The short signal CY, as described above, is afforded to the column driver 4C as a signal indicating the timing of causing a short between the data buses D and !D.

During data reading, from a memory cell located by a row address afforded to the row decoder 3R and a column address afforded to the column decoder 3C, data is read as in the way described in FIGS. 2 and 3, and the data is output onto the data buses D and !D (the inversion of the data read from the memory cell is output onto the data bus !D).

The data output onto the data buses D and !D is amplified in the MA 10 and supplied to the output buffer 11. The output buffer 11, as described above, is adapted to be supplied with a Dout control signal generated in the buffer 1C, and in the output buffer 11, in accordance with the Dout control signal, the data from the MA 10 is latched and output from the output terminal Dout.

On the other hand, during data writing, data to be written is input to the input terminal Din and latched in the input buffer 12. The data latched in the input buffer 12 is amplified in the recording amplifier 13 and output onto the data buses D and !D. The data on the data buses D and !D is written to a memory cell located by a row address afforded to the row decoder 3R and a column address afforded to the column decoder 3C, in the way described in FIGS. 2 and 3.

In the DRAM chip of FIG. 1, since only one memory cell can be specified at a time by a set of a row address afforded to the row decoder 3R and a column address afforded to the column decoder 3C, data reading and data writing can be performed only at different timings. Briefly, data reading and data writing cannot be performed at the same time.

Figure 4:
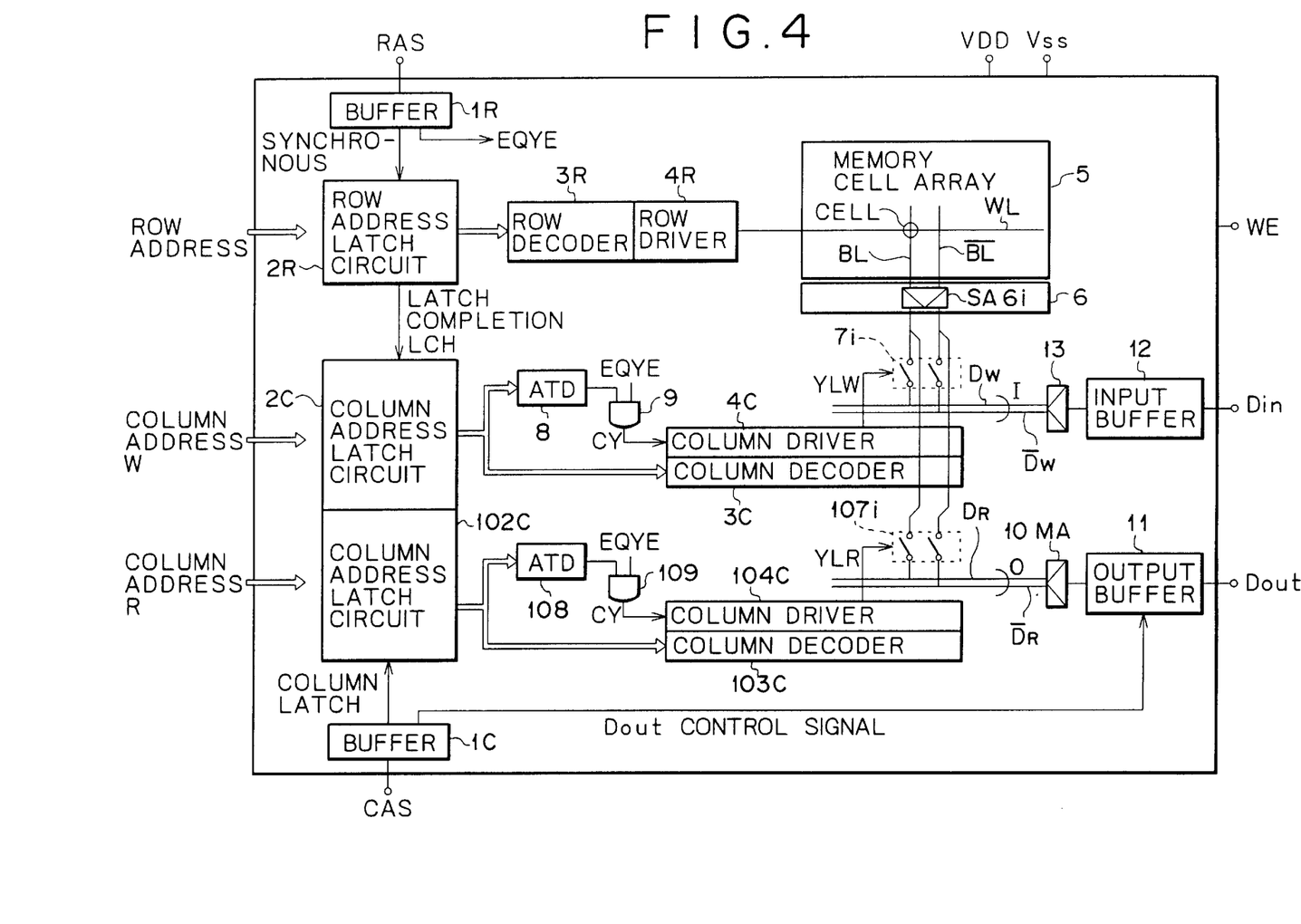
FIG. 4 is a block diagram showing a configuration of an embodiment of a DRAM chip to which the present invention is applied.

FIG. 4 shows a configuration of an embodiment of a DRAM chip to which the present invention is applied. In FIG. 4, portions corresponding to those in FIG. 1 are assigned identical reference numerals and descriptions thereof are hereinafter omitted as required.

The DRAM chip of FIG. 4 is adapted to enable concurrent execution of data reading and data writing.

Specifically, in the DRAM chip of FIG. 4, in parallel with a column address latch circuit 2C, a column decoder 3C, a column driver 4C, a column switch 7i, an ATD circuit 8, and an AND gate 9, there are further provided a column address latch circuit 102C, a column decoder 103C, a column driver 104C, a column switch 107i, an ATD circuit 108, and an AND gate 109 configured in the same way, respectively.

Accordingly, in an embodiment of FIG. 4, the column address latch circuit, column decoder, column driver, column switch, ATD circuit, and AND gate are provided in pairs respectively. Data buses are also tailored for this configuration; that is, in addition to data buses DW and !DW connected with the column switch 7i, data buses DR and !DR connected with the column switch 107 are provided.

Although the data buses DW and !DW in FIG. 4 correspond to the data buses D and !D in FIG. 1, to differentiate them from the data buses DR and !DR, in FIG. 4, they are shown as the data buses DW and !DW, respectively.

The DRAM chip of FIG. 4 is adapted such that, for example, the column address latch circuit 2C, column decoder 3C, column driver 4C, column switch 7i, ATD circuit 8, and AND gate 9 are used for data writing, and the column address latch circuit 102C, column decoder 103C, column driver 104C, column switch 107i, ATD circuit 108, and AND gate 109 are used for data reading, whereby data can be written and read at the same time to and from memory cells of a given row that are different in column.

Specifically, to the row address latch circuit 2R, the row address of the row of memory cells to and from which to write and read data at the same time is supplied and latched. The row address latched in the row address latch circuit 2R is supplied to the row decoder 3R.

To the column address latch circuit 2R, the column address W of the column of memory cells to which to write data is supplied and latched. Further, to the column address latch circuit 102C, the column address R of the column of memory cells from which to read data is supplied and latched. The column addresses W or R latched in the column address latch circuit 2C or 102C are supplied to the column decoders 3C or 103C, respectively.

The column address W latched in the column address latch circuit 2C is also supplied to the ATD circuit 8, as in the case of FIG. 1, and afforded to the column driver 4C as a signal indicating the timing of causing a short between the data buses DW and !DW. Similarly, the column address R latched in the column address latch circuit 102C is also supplied to the ATD circuit 108 and afforded to the column driver 104C as a signal indicating the timing of causing a short between the data buses DR and !DR.

On the other hand, data to be written is input to the input terminal Din and latched in the input buffer 12. The data latched in the input buffer 12 is amplified in the recording amplifier 13 and output onto the data buses DW and !DW. The data on the data buses DW and !DW is written to a memory cell located by the row address afforded to the row decoder 3R and the column address W afforded to the column decoder 3C, as described in FIGS. 2 and 3.

Further, data is read from a memory cell located by the row address afforded to the row decoder 3R and the column address R afforded to the column decoder 103C in the same way as described in FIGS. 2 and 3, and the data is output to the data buses DR and !DR (the inversion of data read from the memory cell is output onto the data bus !DR).

The data output onto the data buses DR and !DR is amplified in the MA 10 and supplied to the output buffer 11. To the output buffer 11, the Dout control signal generated in the buffer IC is supplied. In the output buffer 11, the data from the MA 10 is latched in accordance with the Dout control signal and is output from the output terminal Dout.

In this way, data writing to a memory cell located by a given row address and a column address W, and data reading from a memory cell located by the row address and a different column address R are performed at the same time.

Figure 5:
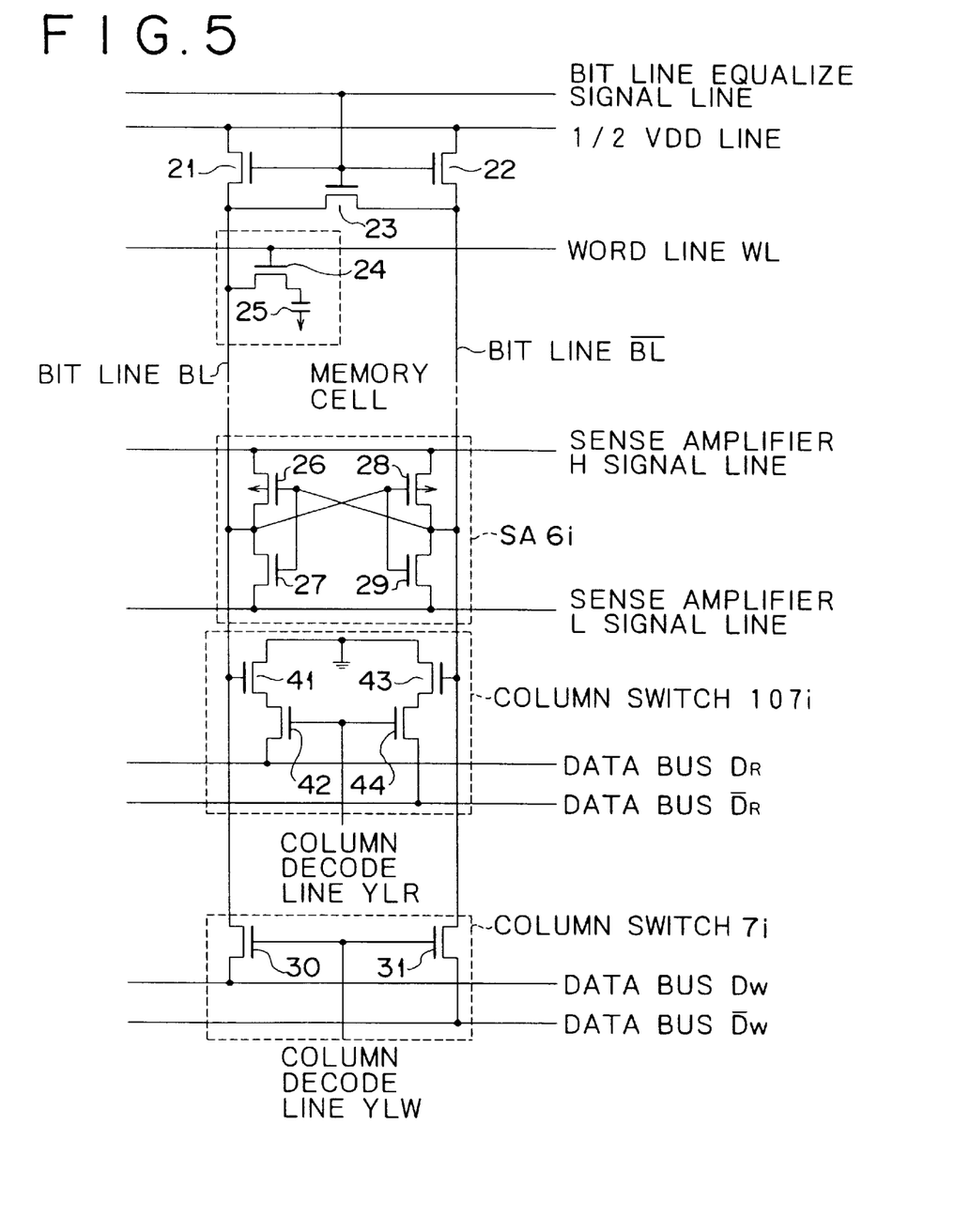
FIG. 5 is a schematic circuit diagram showing a configuration of memory cell arrays 5 and SA6$i$, and a column switches 7$i$ and 107$i$ in FIG. 4.

FIG. 5 shows a configuration of the memory cell array 5, SA 6i, column switch 7i, and column switch 107i in FIG. 4. In FIG. 5, portions corresponding to those in FIG. 2 are assigned identical reference numerals. Specifically, the circuit in FIG. 5 has the same configuration as that in FIG. 2, except that the column switch 107i is newly provided.

The column switch 107i (switching means) is disposed in parallel to the column switch 7i.

Specifically, the column switch 107i comprises FETs (N channel FET) 41 to 44. The gate of FET 41 is connected to the bit line BL and the source thereof is connected with the drain of FET 42. The source of FET 42 is connected to the data bus DR and the gate thereof is connected with the gate of FET 44. The drain of FET 41 is connected with the drain of FET 43 and a connection point between the drains is grounded. Furthermore, the gate of FET 43 is connected with the bit line !BR and the source thereof is connected with the drain of FET 44. The source of FET 44 is connected to the data bus !DR. A connection point between the gates of FETs 42 and 44 is connected to the column decode line YLR.

The column decode line YLR is driven by the column driver 104C and thereby the FETs 42 and 44 constituting the column switch 107i go on or off. When the FETs 42 and 44 are turned on, a voltage (latched product of differential amplification of a voltage of the capacitor 25 in the SA 6i) on the bit line BL is output to the data bus DR via the FETs 41 and 42, and a voltage on the bit line !BL is output to the data bus !DR via the FETs 43 and 44.

In FIG. 5, the column decode line YL in FIG. 2 is shown as column decode line YLW.

Next, the operation is described below.

Assume that the row address m of memory cells of the m-th row of the memory cell array 5 is afforded to the row decoder 3R (m is an integer from 1 to M), and the column address n1 or n2 of memory cells of the n1-th or the n2-th column of the memory cell array 5) is afforded to the column decoder 3C or 103C (n1 and n2 are an integer from 1 to N and n1≠n2).

In this case, as described in FIG. 3, a bit equalize signal is driven from a high level into a low level (FIG. 3A), and the word line WL of the m-th row is driven from a low level into a high level (FIG. 3B) (memory cells of the m-th row are specified). Further, a sense amplifier H signal is driven from a low level into a high level (FIG. 3C) and a sense amplifier L signal is driven from a high level into a low level (FIG. 3D). Thereby, the SAs 61 to 6N are placed into operation.

When the SAs 61 to 6N are placed into operation, in each, a voltage, developing on a bit line BL, of a capacitor 25 constituting a memory cell of the m-th row specified by a row address m is differentially amplified and latched. As a result, as shown in FIG. 3E, the voltage of the bit line BL changes from VDD/2 to either of a high level and a low level, and the voltage of a bit line !BL changes from VDD/2 to the other.

The column driver 4C drives a column decode line YLW connected to a column switch 7n1 of the n1-th column from a low level into a high level as shown in FIG. 3G, whereby the column switch 7n1 of the n1-th column is placed from the off state into the on state. Accordingly, bit lines BL and !BL of the n1-th column are electrically connected with the data buses DW and !DW.

Thereafter, when data to be written has been output onto the data buses DW and !DW via the input buffer 12 and recording amplifier 13, charges corresponding to the data to be written are charged to the capacitor 25 via the bit line BL of the n1-th column and FET 24. Thereby, the data to be written is stored in a memory cell of the m-th row, the n1-th column.

On the other hand, the column driver 104C drives a column decode line YLR connected to a column switch 107n2 of the n2-th column from a low level into a high level as shown in FIG. 3G, whereby the column switch 107n2 of the n2-th column is placed from the off state into the on state. Accordingly, bit lines BL and !BL of the n2-th column are electrically connected with the data buses DR and !DR.

In this way, bit lines BL and !BL of the n2-th column are connected with data buses DR and !DR, whereby a voltage of the capacitor 25 differentially amplified in the SA 6n2 of the n2-th column, namely, data stored in a memory cell of the m-th row, the n2-th column comprising the FET 24 and capacitor 25 is output onto the data buses DR and !DR (data stored in the memory cell is output onto the data bus DR and the inversion of data stored in the memory cell is output to the data bus !DR). The data on the data buses DR and !DR is output via the MA 10 and the output buffer 11.

In the way described above, data writing to a memory cell of the m-th row, the n1-th column and data reading from a memory cell of the m-th row, the n2-th column are performed at the same time.

Specifically, in the DRAM chip of FIG. 4, since two column switches 7i and 107i are disposed in parallel to enable data reading and writing from and to a memory cell of the m-th row, the n-th column, without the need to provide SRAM as buffer that has been heretofore provided, data writing to either of a memory cell of the n1-th column and one of the n2-th column of those of the m-th row and data reading from the other can be performed. As a result, there can be provided a small-size semiconductor memory that enables concurrent execution of data reading and data writing.

A column address latch circuit 102C, a column decoder 103C, a column driver 104C, a column switch 107i, an ATD circuit 108, and an AND gate 109 can be made sufficiently compact in construction, in comparison with SRAM shown in FIGS. 8 and 9.

According to the described above DRAM chip enabling concurrent execution of data reading and data writing, in the case of a read modify write that reads data from the DRAM chip, performs operations on the data, and writes the processed data to the DRAM chip, data reading and data writing after operations can be performed in one cycle (clock), thereby contributing to faster processing.

Such read modifier operations in one cycle can, for example, be applied to hierarchical coding of images (other image processing).

Figure 6:
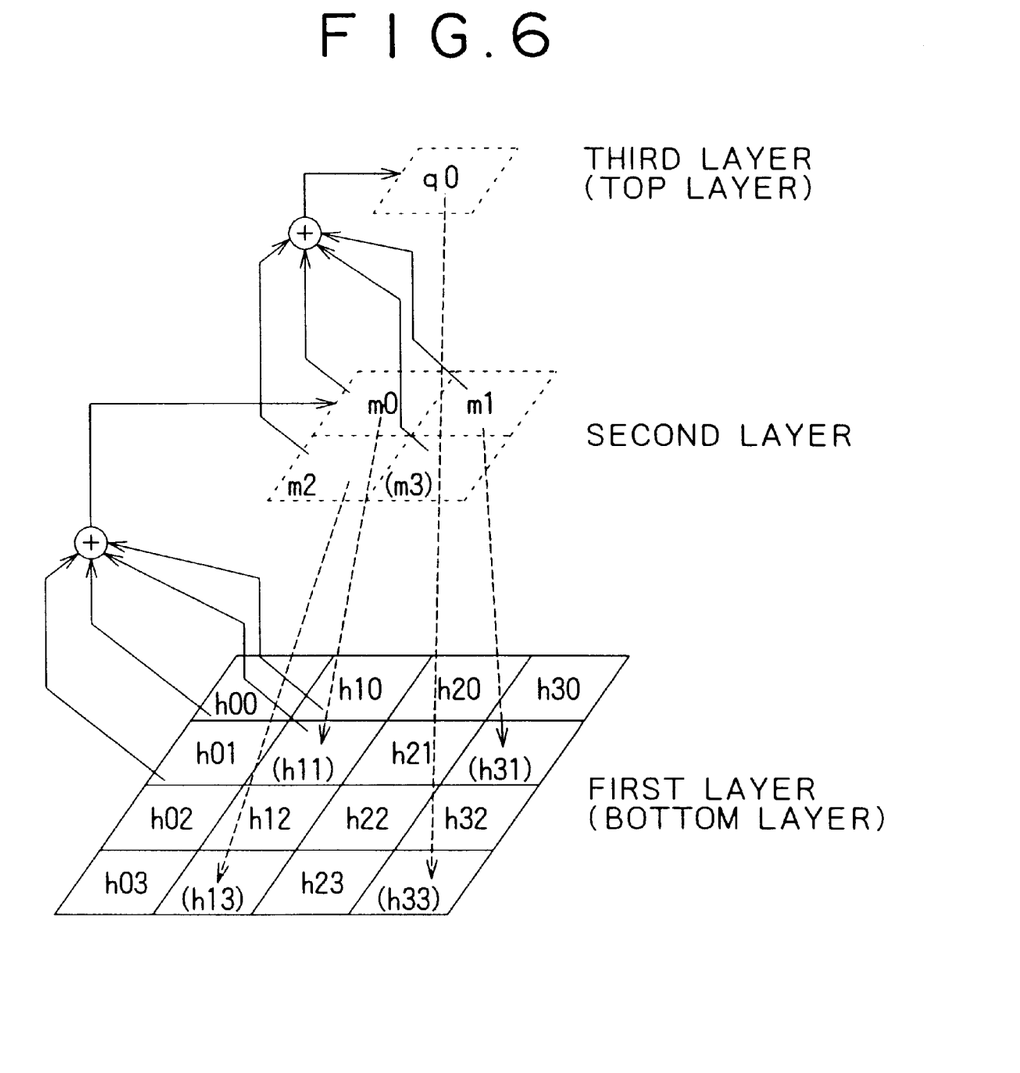
FIG. 6 is a diagram for explaining hierarchical coding.

Referring now to FIG. 6, hierarchical coding will be described briefly.

For example, assume that hierarchical coding of three layers is performed such that a value resulting from addition of four pixels of 2 by 2 pixels (width by length) is a pixel (pixel value) of a higher level layer. In this case, if an image of bottom layer, for example, consists of 4 by 4 pixels as shown in FIG. 6, a value m0 is calculated by adding four pixels h00, h10, h01, and h11 of 2 by 2 pixels at the upper left corner of the bottom layer, forming one pixel of the upper left corner of the second layer. Similarly, values m1, m2, and m3 are calculated by adding four pixels h20, h30, h21, and h31 at the upper right corner of the image of the bottom layer, four pixels h02, h12, h03, and h13 at the lower left corner, and four pixels h22, h32, h23, and h33 at the lower right corner, respectively, and form one pixel at the upper right corner, lower left corner, and lower right corner of the second layer, respectively. Further, a value qo is calculated by adding four pixels m0, m1, m2, and m3 of 2 by 2 pixels of the second layer, forming a pixel of an image of the third layer, or the top layer in this example.

Storing all the above described pixels h00 to h33, m0 to m3, and q0 would require extra storage capacity for the pixels m0 to m3 of the second layer and the pixel q0 of the third layer.

Accordingly, as shown in FIG. 6, the pixel q0 of the third layer is disposed in the position of the pixel m3 in the lower right corner, for example, of the pixels m0 to m3 of the second layer. Thereby, the second layer will be comprised of the pixels m0 to m2 and q0.

Furthermore, as shown in FIG. 6, the pixel m0 of the second layer is disposed in the position of the pixel h11 at the lower right corner, for example, of the pixels h00, h10, h01, and h11 of the first layer, which have been used to obtain the pixel m0. The remaining pixels m1, m2, and q0 of the second layer are also similarly disposed instead of the pixels h31, h13, and h33 of the first layer. Although the pixel q0 has not been directly calculated from the pixels h22, h32, h23, and h33 of the first layer, since it is disposed in the second layer instead of m3 having been calculated directly from them, the pixel q0, instead of the pixel m3, is disposed in the position of the pixel h33.

By making this arrangement, the number of all pixels is 4 by 4 pixels (=16 pixels), which is the same as the number of pixels of the original bottom layer. Accordingly, in this case, an increase of the storage capacity can be avoided.

In the above described hierarchical coding, the pixels m3 and h33 replaced by the pixel q0, and the pixels h11, h31, and h13 replaced by the pixels m0 to m2, respectively, can be decoded as described below.

Specifically, since q3 is a value obtained by adding m0 to m3, an expression q0=m0+m1+m3 is satisfied. Accordingly, m3 can be obtained by an expression m3=q0−(m0+m1+m2).

Since m0 is a value obtained by adding h00, h10, h01, and h11, an expression m0=h00+h10+h01+h11 is satisfied. Accordingly, h11 can be obtained by an expression h11=m0−(h00+h10+h01). Similarly, h31, h13, and h33 can be obtained. h33 is obtained after m3 is obtained, as described above.

Figure 7A:
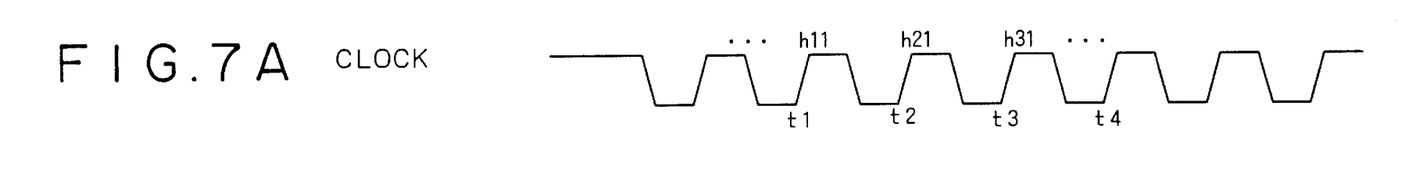
FIGS. 7A to 7D are timing charts for explaining hierarchical coding performed using read modify write.

In the above described hierarchical coding, for example, on the assumption that the pixels h00, h10, h20, and h30 of the first row, and the pixel h01 of the second row are already stored in the DRAM chip of FIG. 4, and the pixels of the bottom layer are supplied to the DRAM chip in a so-called line scan order synchronously with the clock shown in FIG. 7A, fast hierarchical coding could be implemented by performing processing shown in the timing chart of FIG. 7, for example.

Figure 7B:
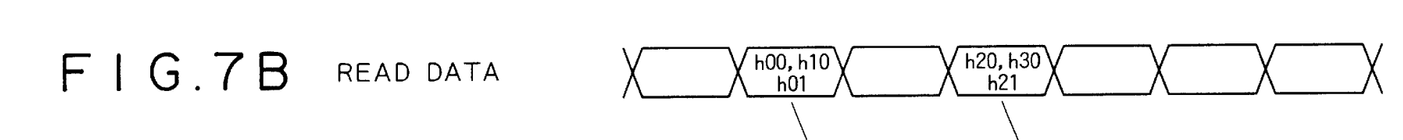

Specifically, as shown in FIG. 7A, on the assumption that the second pixel h11 of second row is supplied to the DRAM chip at the timing of a clock t2, the pixels h00, h10, and h01 already stored are read from the DRAM chip at that timing, as shown in FIG. 7B.

Figure 7C:
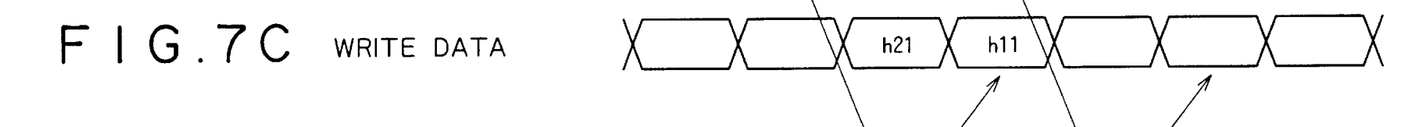
Figure 7D:
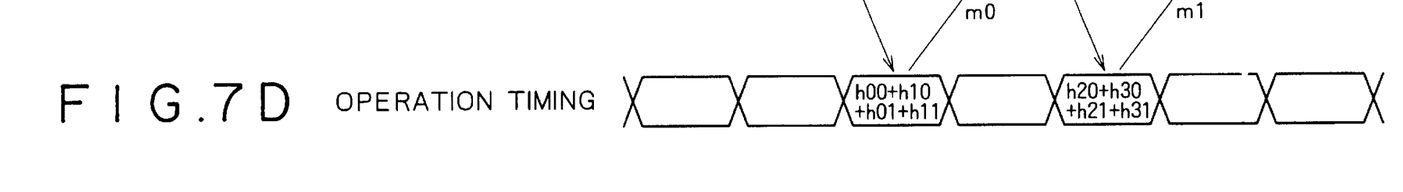

The pixel h21 at the left of the pixel h11 of second row is supplied at the timing of the next clock t2. While writing the pixel h21 to the DRAM chip (FIG. 7C), by adding all the pixels h00, h10, and h01 read at the previous clock t1 and the supplied pixel h11, the pixel m0 at the upper left corner of second layer is obtained (FIG. 7D).

Further, at the timing of the next clock t3, the pixel h31 at the left of the pixel h21 of second row is supplied. At that timing, at the same time as when the pixels h20, h30, and h21 used to obtain the pixel m1 of second layer, along with the pixel h31, are read from the DRAM chip (FIG. 7B), the pixel m0 of second layer obtained at the timing of the previous clock t2 is written to the DRAM chip (FIG. 7C). Briefly, reading of the pixels h20, h30, and h21 and writing of the pixel m0 are performed at the same time.

At the timing of the next clock, the pixel m1 of the upper left corner of second layer is obtained by adding all the pixels h20, h30, and h21 read at the previous clock t2, and the supplied pixel h31 (FIG. 7D), and thereafter, hierarchical coding can be performed by repeating the same processing.

In this embodiment, two column switches 7$i$ and 107$i$ are disposed in parallel to enable data reading and writing from and to a memory cell of the m-th row, the n-th column. Alternatively, three or more column switches may be provided in parallel. In this case, in the DRAM chip, data reading and data writing can be performed at the same time for as many memory cells (memory cells of an identical row) as column switches provided in parallel.

In this embodiment, data is written to the memory cell 5 via the column switch 7$i$, and at the same time, data is read from the memory cell array 5 via the column switch 107$i$. Alternatively, data can be written to the memory cell array 5 via the column switch 7$i$, and at the same time via the column switch 107$i$, or data can be read from the memory cell 5 via the column switch 7$i$, and at the same time via the column switch 107$i$.

Although a memory cell is located by two addresses, a row address and a column address in this embodiment, it can also be located by three or more addresses, for example.

What is claimed is:

1. A memory device for storing data, comprising:
   storage means having an array of storage units, a first storage unit being specified by a first address and a second address, and a second storage unit being specified by said first address and a third address;
   first specifying means for specifying said first address;
   second specifying means for specifying said second address;
   third specifying means for specifying said third address;
   writing means for writing data into said first storage unit as specified by said first address and said second address;
   reading means for reading data out of said second storage unit as specified by said first address and said third address; and
   a plurality of switching means for connecting said first storage unit to said writing means and at the same time connecting said second storage unit to said reading means such that data is written into and read out of said memory device at the same time.

2. The memory device according to claim 1, wherein said array of storage units are disposed in rows and columns; each storage unit being located by a row and a column, said first address corresponding to a row and said second and third addresses corresponding to columns.

3. The memory device according to claim 2, further comprising input and output data buffers for buffering data being written to and read from said storage means, respectively.

4. The memory device according to claim 3, wherein said storage means is a DRAM semiconductor memory.

5. The memory device according to claim 4, wherein the data is image data and said memory device performs hierarchical data encoding.

6. A memory device control method for storing data in a memory device having an array of storage units, comprising the steps of:

specifying a first address, a second address, and a third address; said first address and said second address specifying a first storage unit in said memory device, and said first address and said third address specifying a second storage unit in said memory device;

connecting said first storage unit as specified by said first address and said second address to a writing means and at the same time connecting said second storage unit as specified by said first address and said third address to a reading means; and writing data into said first storage unit and reading data out of said second storage unit at the same time.

7. The memory device control method according to claim 3, wherein said array of storage units are disposed in rows and columns; each storage unit being located by a row and a column, said first address corresponding to a row and said second and third addresses corresponding to columns.

8. The memory device control method according to claim 6, further comprising the steps of buffering data written to and read from said storage means, respectively.

9. The memory device control method according to claim 8, wherein said storage means is a DRAM semiconductor memory.

10. The memory device control method according to claim 9, wherein the data is image data and further comprising the step of performing hierarchical data encoding.

* * * * *